United States Patent
Gao et al.

(10) Patent No.: US 11,315,523 B2
(45) Date of Patent: Apr. 26, 2022

(54) EMISSION CONTROLLER, DRIVING METHOD, AND DISPLAY DEVICE

(71) Applicant: Shanghai Tianma AM-OLED Co., Ltd., Shanghai (CN)

(72) Inventors: Yana Gao, Shanghai (CN); Xingyao Zhou, Shanghai (CN); Yue Li, Shanghai (CN); Dongxu Xiang, Shanghai (CN); Renyuan Zhu, Shanghai (CN); Zhonglan Cai, Shanghai (CN); Juan Zhu, Shanghai (CN); Gaojun Huang, Shanghai (CN); Yilin Xu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 17/135,016

(22) Filed: Dec. 28, 2020

(65) Prior Publication Data

US 2021/0118406 A1 Apr. 22, 2021

Related U.S. Application Data

(62) Division of application No. 16/137,602, filed on Sep. 21, 2018, now Pat. No. 10,909,950.

(30) Foreign Application Priority Data

Mar. 26, 2018 (CN) .......................... 201810253070.6

(51) Int. Cl.
*G09G 5/10* (2006.01)
(52) U.S. Cl.
CPC ....... *G09G 5/10* (2013.01); *G09G 2300/0426* (2013.01); *G09G 2310/0286* (2013.01); *G09G 2310/08* (2013.01)

(58) Field of Classification Search
CPC ............ G09G 5/10; G09G 2300/0426; G09G 2310/0286; G09G 2310/08; G09G 3/3208;
(Continued)

(56) References Cited

U.S. PATENT DOCUMENTS

2016/0358566 A1 12/2016 Li
2017/0352311 A1 12/2017 Lee
(Continued)

FOREIGN PATENT DOCUMENTS

CN 104064153 A 9/2014

*Primary Examiner* — Mark W Regn
(74) *Attorney, Agent, or Firm* — Tarolli, Sundheim, Covell & Tummino LLP

(57) ABSTRACT

The present disclosure provides an emission controller, a driving method thereof, and a display device. The emission controller includes a first processing module, a second processing module, a third processing module, an output module and a shift control module. The first processing module generates a first signal in response to a first control signal, a second control signal and a second signal. The second processing module generates a second signal in response to the first control signal and the first signal. The third processing module generates third and fourth signals in response to the second control signal, the second and first signals. The output module provides emission control signal in response the first and fourth signal. The shift control module provides a shift control signal in response to the first and fourth signal, or provides a shift control signal in response to the first and third signal.

13 Claims, 5 Drawing Sheets

(58) Field of Classification Search
CPC ......... G09G 2320/0209; G09G 3/3266; G09G 3/20; G11C 19/28
See application file for complete search history.

(56) References Cited

U.S. PATENT DOCUMENTS

2018/0374410 A1    12/2018   Zhu
2021/0118405 A1*   4/2021   Gao ..................... G09G 3/3208

* cited by examiner

EMISSION CONTROLLER, DRIVING METHOD, AND DISPLAY DEVICE

CROSS-REFERENCE TO RELATED APPLICATIONS

The present disclosure is a divisional application of U.S. Ser. No. 16/137,602, filed Sep. 21, 2018, which claims priority to Chinese Patent Application No. 201810253070.6, filed on Mar. 26, 2018; the content of these applications is incorporated herein by reference in its entirety.

TECHNICAL FIELD

The present disclosure relates to the field of display technologies, and in particular, to an emission control circuit, a driving method for the emission control circuit, an emission controller, and a display device.

BACKGROUND

Generally, a display device includes a plurality of sub-pixels disposed on a display panel and an emission controller for driving a sub-pixel to emit light. The emission controller includes a plurality of cascaded emission control circuits.

In the related art, each emission control circuit includes an output terminal, which is connected to an emission control line provided in a display area and to a starting signal terminal of a next emission control circuit. However, with such connecting manner, wiring in the display area would influence an emission control signal output by the emission control circuit, thereby influencing inputting a starting signal into the next emission control circuit and further impacting the display quality.

SUMMARY

The present disclosure provides an emission control circuit, a driving method, an emission controller, and a display device, which are used to improve stability of a starting signal received by the emission control circuit and improve the display quality.

In a first aspect, the present disclosure provides an emission control circuit, including: a first processing module, a second processing module, a third processing module, an output module, and a shift control module. The first processing module is electrically connected to a starting signal terminal, a first voltage signal terminal, a first control signal terminal, and a second control signal terminal. The first processing module generates a first signal to a first node in response to a first control signal, a second control signal, and a second signal. The second processing module is electrically connected to the first control signal terminal and a second voltage signal terminal. The second processing module generates the second signal to a second signal node in response to the first control signal and the first signal. The third processing module is electrically connected to the second control signal terminal and the first voltage signal terminal. The third processing module generates a third signal to a third node and generates a fourth signal to a fourth node in response to the second control signal, the second signal, and the first signal. The output module is electrically connected to the first voltage signal terminal, the second voltage signal terminal, and an output terminal. The output module provides an emission control signal to the output terminal in response to the first signal and the fourth signal.

The shift control module is electrically connected to the first voltage signal terminal and a shift control terminal. The shift control module provides a shift control signal to the shift control terminal in response to the first signal and the fourth signal, or the shift control module provides a shift control signal to the shift control terminal in response to first signal and the third signal.

In a second aspect, the present disclosure provides a driving method for the abovementioned emission control circuit. The driving method includes steps of: in a first period in which the starting signal terminal provides low level, the first control signal terminal provides low level and the second control signal terminal provides high level, generating, by the first processing module, low level to the first node in response to low level provided by the first control signal terminal, generating, by the second processing module, low level to the second node in response to low level provided by the first control signal terminal and low level at the first node, generating, by the third processing module, high level to the third node and high level to the fourth node in response to low level at the second node and low level at the first node, controlling, by the output module, the output terminal to output low level in response to low level at the first node, and controlling, by the shift control module, the shift control terminal to output low level in response to the first signal; in a second period in which the starting signal terminal provides low level, the first control signal terminal provides high level, the second control signal terminal provides low level, and the first node is maintained at low level, generating, by the second processing module, high level to the second node in response to low level at the first node, maintaining high level at the third node, maintaining high level at the fourth node, maintaining low level output at the output terminal, and maintaining low level output at the shift control terminal; in a third period in which the starting signal terminal provides high level, the first control signal terminal provides low level, and the second control signal terminal provides high level, generating, by the first processing module, high level to the first node in response to low level provided by the first control signal terminal, generating, by the second processing module, low level to the second node in response to low level provided by the first control signal terminal, generating, by the third processing module, high level to the third node in response to low level at the second node, maintaining high level at the fourth node, maintaining low level output at the output terminal, and maintaining low level output at the shift control terminal; in a fourth period in which the starting signal terminal provides high level, the first control signal terminal provides high level, the second control signal terminal provides low level, and the first node is maintained at high level and the second node is maintained at low level, generating, by the third processing module, low level to the third node and low level to the fourth node in response to low level at the second node and low level provided by the second control signal terminal, controlling, by the output module, the output terminal to output high level in response to low level at the fourth node, and controlling, by the shift control module, the shift control terminal to output high level in response to low level at the third node or the fourth node; and in a fifth period, the starting signal terminal provides high level, the first control signal terminal provides low level, the second control signal terminal provides high level, and the first node is maintained at high level and the second node is maintained at low level, generating, by the third processing module, high level to the third node in response to low level at the second node, maintaining low level at the fourth node, maintaining high level output at the output module, controlling, by the shift control module, the shift control terminal to output high level in response to low level at the third node, or controlling, by the shift control module, the shift control terminal to output high level or low level in response to low level at the fourth node.

In a third aspect, the present disclosure provides an emission controller, and the emission controller includes a plurality of cascaded emission control circuits. Among the plurality of cascaded emission control circuits, the shift control terminal of an emission control circuit is electrically connected to the starting signal terminal of a next emission control circuit.

In a fourth aspect, the present disclosure provides a display device, and display device includes the abovementioned emission controller.

BRIEF DESCRIPTION OF DRAWINGS

In order to more clearly illustrate technical solutions in embodiments of the present disclosure or in the related art, the accompanying drawings used in the embodiments and in the related art are briefly introduced as follows. Obviously, the drawings described as follows are merely part of the embodiments of the present disclosure, and other drawings can also be acquired by those skilled in the art without paying creative efforts.

DESCRIPTION OF EMBODIMENTS

For better illustrating the technical solutions of the present disclosure, the embodiments of the present disclosure will be described in detail as follows with reference to the accompanying drawings.

It should be noted that, the described embodiments are merely exemplary embodiments of the present disclosure, which shall not be interpreted as providing limitations to the present disclosure. All other embodiments obtained by those skilled in the art without creative efforts according to the embodiments of the present disclosure are within the protection scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three conditions of: A only, both A and B, and B only. Furthermore, the character "/" in the text generally indicates an "or" relationship of the previous and following related objects.

It should be understood that, although the processing module may be described using the terms of "first", "second", "third", etc., in the embodiments of the present disclosure, the processing module will not be limited to these terms. These terms are merely used to distinguish the processing modules from one another. For example, without departing from the scope of the embodiments of the present disclosure, a first processing module may also be referred to as a second processing module, and similarly, a second processing module may also be referred to as a first processing module.

For better illustrating the technical solutions provided by the embodiments of the present disclosure, the structure of the display device will first be described in details in the following.

Figure 1:
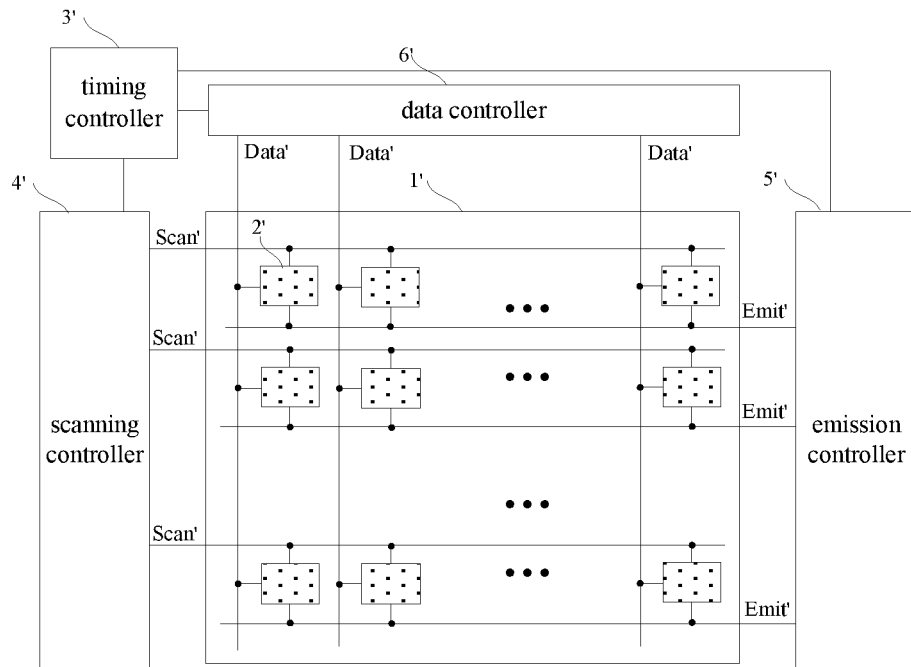
FIG. 1 is a structural schematic diagram of a display device in the related art.

As shown in FIG. 1, which is a structural schematic diagram of a display device in the related art, the display device includes a display panel 1'. The display panel 1' is provided thereon with a plurality of sub-pixels 2' arranged in m rows and n columns. In addition, the display device further includes a timing controller 3', a scanning controller 4', an emission controller 5', and a data controller 6'. The scanning controller 4' has m output terminals, each of which is connected to a row of sub-pixels 2' through a respective one scanning line Scan'. The emission controller 5' has m output terminals, each of which is connected to a row of sub-pixels 2' through a respective one emission control line Emit'. The data controller 6' has n output terminals, each of which is connected to a column of sub-pixels 2' through a respective one data line Data'. The timing controller 3' is connected to the scanning controller 4', the emission controller 5', and the data controller 6, and is configured to provide a corresponding driving signal to the scan controller 4', the emission controller 5', and the data controller 6', respectively.

The timing controller 3' generates a first driving signal, a second driving signal, and a third driving signal in response to a received control signal. The scanning controller 4' generates a scanning signal in response to a first control signal, and the scanning signal is sequentially applied to a first row of sub-pixels 2' to an $m^{th}$ row of sub-pixels 2' through the m scanning lines Scan'. The data controller 6' generates a data signal in response to a second control signal, and the data signal is applied to a first column of sub-pixels 2' to an $n^{th}$ row of sub-pixels 2' through the n data lines Data'. The emission controller 5' generates an emission control signal in response to a third control signal, and the emission control signal is applied to the first row of sub-pixels 2' to the $m^{th}$ row of sub-pixels 2' through the m emission control lines. When an $i^{th}$ row of sub-pixels 2' receive the emission control signal, the $i^{th}$ row of sub-pixels 2' emit light under the effect of the data signal applied in advance, where i=1-m.

Figure 2:
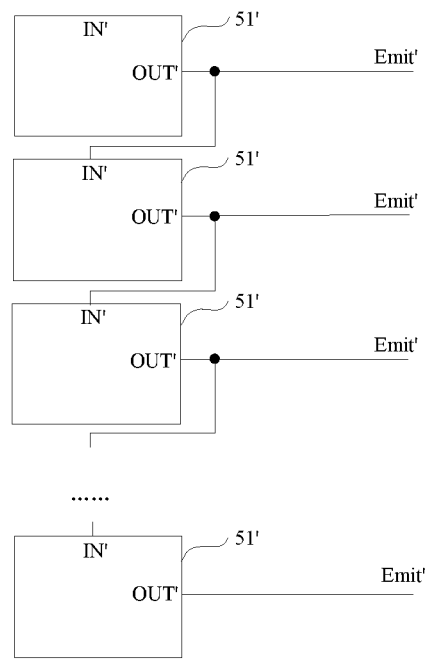
FIG. 2 is a structural schematic diagram of an emission controller in the related art.

As shown in FIG. 2, FIG. 2 is a structural schematic diagram of an emission controller in the related art. In the related art, the emission controller 5' includes m cascaded emission control circuits 51', each of which has an output terminal OUT' connected to one emission control line Emit'. In addition, for two adjacent cascaded emission control circuits, an output terminal OUT' of an emission control circuit is connected to a starting signal terminal IN' of the next emission control circuit.

Since the output terminal OUT' of each emission control circuit 51' is connected to an emission control line Emit' located in the display area, on the one hand, with the influence of the wiring load of the emission control line Emit' and the coupling capacitance at an overlapping area between the emission control line Emit' and the other wiring, there would be a certain delay for the emission control signal outputted from the emission control circuit 51'. If the wiring load and the coupling capacitance are large, the delay for the emission control signal would be too large, thereby impacting inputting the starting signal into the next emission control circuit. On the other hand, when the emission control line Emit' is short-circuited with another line, the emission control signal may be interfered by another signal, resulting in that an electric potential of the emission control signal may deviate from its standard value and thereby influencing inputting the starting signal into the next emission control circuit.

Therefore, with the solution in the related art, each emission control circuit 51' is connected to both the emission control line Emit' and the starting signal terminal IN' of the next emission control circuit, and the wiring in the display area has an impact on the emission control signal outputted by the emission control circuit 51', thereby influencing inputting the starting signal into the next emission control circuit and further influencing normal display of an image.

Figure 3:
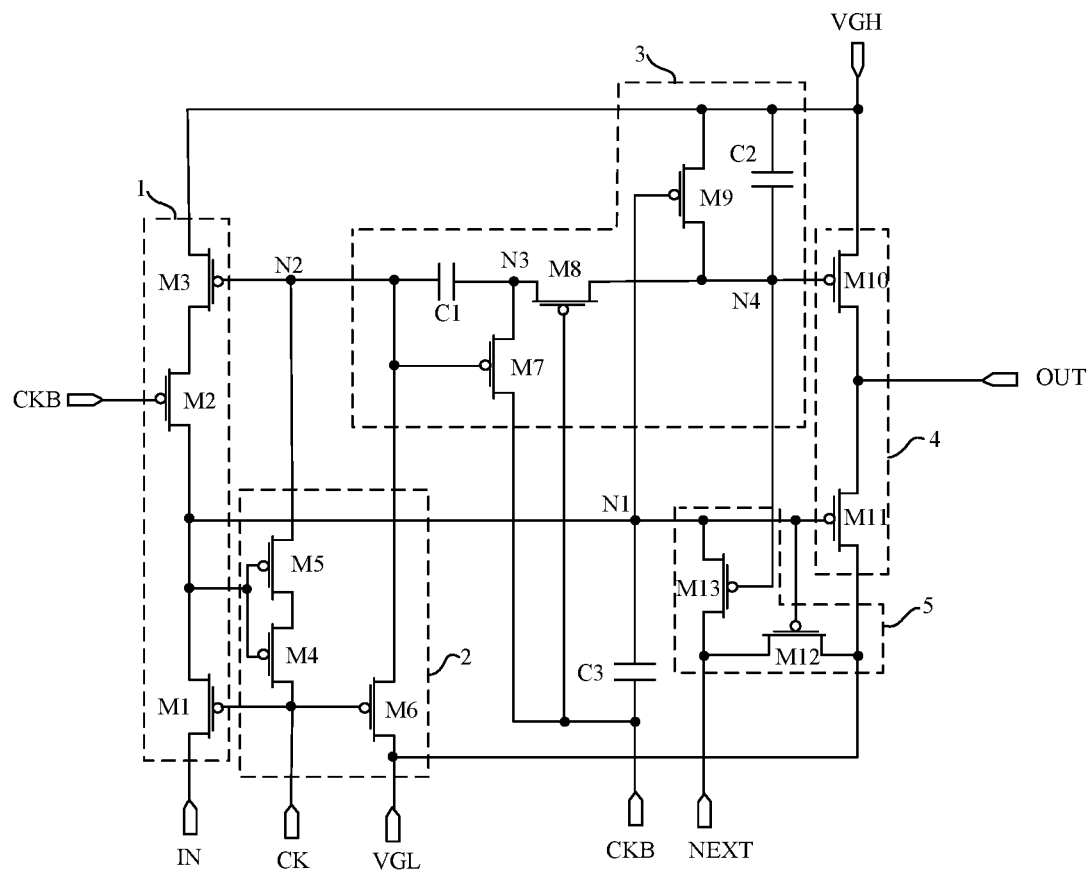
FIG. 3 is a structural schematic diagram of an emission control circuit according to an embodiment of the present disclosure.

In order to solve the abovementioned problem, an embodiment of the present disclosure provides an emission control circuit. As shown in FIG. 3, which is a structural schematic diagram of an emission control circuit according to an embodiment of the present disclosure, the emission control circuit includes a first processing module 1, a second processing module 2, a third processing module 3, an output module 4, and a shift control module 5.

The first processing module1 is electrically connected to a starting signal terminal IN, a first voltage signal terminal VGH, a first control signal terminal CK, and a second control signal terminal CKB. The first processing module 1 generates a first signal to a first node N1 in response to a first control signal, a second control signal provided by the second control signal terminal CKB and a second signal. The processing module 2 is electrically connected to the first control signal terminal CK and a second voltage signal terminal VGL. The second processing module 2 generates the second signal to a second node N2 in response to a first control signal provided by the first control signal terminal CK and the first signal. The third processing module 3 is electrically connected to the second control signal terminal CKB and the first voltage signal terminal VGH. The third processing module 3 generates a third signal at a third node N3 and a fourth signal to a fourth node N4 in response to the second control signal, the second signal and the first signal. The output module 4 is electrically connected to the first voltage signal terminal VGH, the second voltage signal terminal VGL and the output terminal OUT, and the output module 4 provides the emission control signal to the output terminal OUT in response to the first signal and a fourth signal. The shift control module 5 is electrically connected to the first voltage signal terminal VGH and a shift control terminal NEXT. The shift control module 5 provides a shift control signal to the shift control terminal NEXT in response to the first signal and the fourth signal, or, the shift control module 5 provides the shift control signal to the shift control terminal NEXT in response to the first signal and the third signal.

It should be noted that in the emission control circuit provided by the embodiments of the present disclosure, the output terminal OUT of the emission control circuit is connected to a light-emitting control line, and the output terminal OUT is used to output an emission control signal. The emission control signal is transmitted to a sub-pixel through the light-emitting control line so as to drive the corresponding sub-pixel to emit light. The shift control terminal NEXT is connected to the starting signal terminal IN of the next emission control circuit, and the shift control terminal NEXT is used to transmit a starting signal to the next emission control circuit so as to drive the next emission control circuit to operate.

Taking the first emission control circuit and the second emission control circuit as an example, and in combination with FIG. 4, which is a signal sequence diagram corresponding to FIG. 3, the driving method for the emission control circuit will be described in details as follows.

First, it can be understood that the first control signal terminal CK of the first emission control circuit and the second control signal terminal CKB of the second emission control circuit are connected to a first clock signal line, and the second control signal terminal CKB of the first emission control circuit and the first control signal terminal CK of the second emission control circuit are connected to a second clock signal line.

A driving period for each emission control circuit includes a first period to a fifth period.

Figure 4:
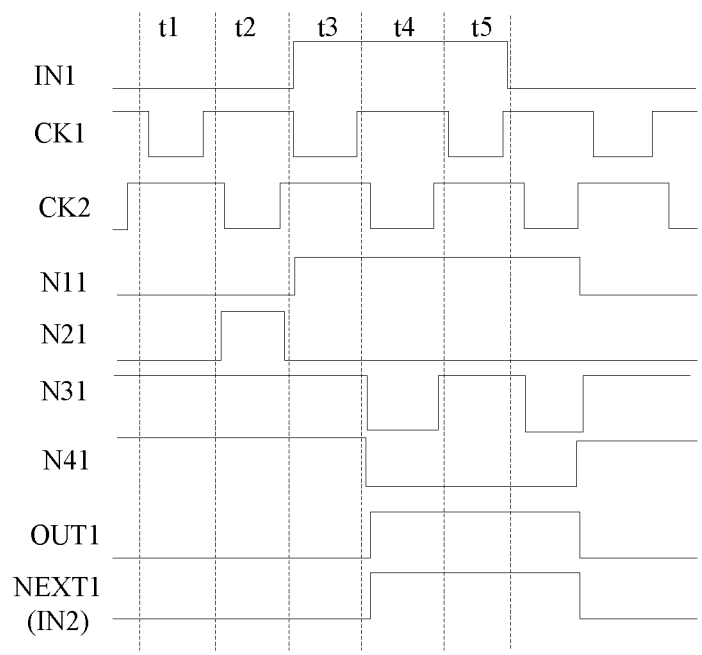
FIG. 4 is a signal sequence diagram corresponding to FIG. 3.

In the first period t1 of the first emission control circuit, the starting signal terminal IN of the first emission control circuit provides low level, the first clock signal line provides low level, and the second clock signal line provides high level (for the sake of understanding, the signals provided by the first clock signal line and the second clock signal line are respectively denoted by CK1 and CK2 in FIG. 4). The first processing module 1 generates low level to the first node N1 in response to low level received by the first control signal terminal CK (for the sake of understanding, signals at the first node N1 to the fourth node N4 of the first emission control circuit are respectively denoted by N11 to N41 in FIG. 4). The second processing module 2 generates low level to the second node N2 in response to low level received by the first control signal terminal CK and low level at the first node N1. The third processing module 3 generates high level to the third node N3 and generates high level to the fourth node N4 in response to low level at the second node N2 and low level at the first node N1. The output module 4 causes the output terminal OUT to output low level in response to low level at the first node N1 (for the sake of understanding, the signal outputted by the output terminal OUT of the first emission control circuit is denoted by OUT1 in FIG. 4). The shift control module 5 causes the shift control terminal NEXT to output low level in response to the first signal (for the sake of understanding, the signal outputted by the shift control terminal NEXT of the first emission control circuit is denoted by NEXT1).

In the second period t2 of the first emission control circuit, the starting signal terminal IN provides low level, the first clock signal line provides high level, and the second clock signal line generates low level. The first node N1 maintains at low level. The second processing module 2 provides high level to the second node N2 in response to low level at the first node N1. The third node N3 maintains at high level. The fourth node N4 maintains at high level. The output terminal OUT maintains low level output. The shift control terminal NEXT maintains low level output. At the same time, the starting signal terminal IN of the second emission control circuit receives low level outputted by the shift control terminal NEXT of the first emission control circuit, the first control signal terminal CK of the second emission control circuit receives low level provided by the second clock signal line, the second control signal terminal CKB of the second emission control circuit receives high level provided by the first clock signal line, and the second emission control circuit is in the first period t1.

In the third period t3 of the first emission control circuit, the starting signal terminal IN provides high level, the first clock signal line provides low level, and the second clock signal line provides high level. The first processing module 1 generates high level to the first node N1 in response to low level received by the first control signal terminal CK. The second processing module 2 generates low level to the second node N2 in response to low level received by the first control signal terminal CK. The third processing module 3 generates high level to the third node N3 in response to low level at the second node N2. The fourth node N4 maintains at high level. The output terminal OUT maintains low level output. The shift control terminal NEXT maintains low level output. At the same time, the starting signal terminal IN of the second emission control circuit receives low level outputted by the shift control terminal NEXT of the first emission control circuit, the first control signal terminal CK of the second emission control circuit receives high level provided by the second clock signal line, the second control signal terminal CKB of the second emission control circuit receives low level provided by the first clock signal line, and the second emission control circuit is in the second period t2.

In the fourth period t4 of the first emission control circuit, the starting signal terminal IN provides high level, the first clock signal line provides high level, and the second clock signal line provides low level. The first node N1 maintains at high level. The second node N2 maintains at low level. The third processing module 3 generates low level to the third node N3 and generates low level to the fourth node N4 in response to low level at the second node N2 and low level received by the second control signal terminal CKB. The output module 4 causes the output terminal OUT to output high level response to low level at the fourth node N4. The shift control module 5 causes the shift control terminal NEXT to output high level in response to low level at the third node N3 or the fourth node N4. At the same time, the starting signal terminal IN of the second emission control circuit receives high level outputted by the shift control terminal NEXT of the first emission control circuit, the first control signal terminal CK of the second emission control circuit receives low level provided by the second clock signal line, the second control signal terminal CKB of the second emission control circuit receives high level provided by the first clock signal line, and the second emission control circuit is in the third time period t3.

In the fifth period t5 of the first emission control circuit, the starting signal terminal IN provides high level, the first clock signal line provides low level, and the second clock signal line provides high level. The first node N1 maintains at high level. The second node N2 maintains at low level. The third processing module 3 generates high level to the third node N3 in response to low level at the second node N2. The fourth node N4 maintains at low level. The output module 4 maintains high level output. The shift control module 5 causes the shift control terminal NEXT to output high level in response to low level at the third node N3, or, the shift control module 5 causes the shift control terminal NEXT to output high level or low level in response to low level at the fourth node N4. At the same time, the starting signal terminal IN of the second emission control circuit receives high level or low level outputted by the shift control terminal NEXT of the first emission control circuit, the first control signal terminal CK of the second emission control circuit receives high level provided by the second clock signal line, the second control signal terminal CKB of the second emission control circuit receives low level provided by the first clock signal line, and the second emission control circuit is in the fourth period t4.

According to the analysis of the driving process of the emission control circuit described above, based on the structure of the emission structuring circuit provided by the embodiments of the present disclosure, a plurality of emission control circuits sequentially outputs a light-emitting control signal so as to achieve time-division driving of multiple rows of sub-pixels. Moreover, the emission control circuit outputs a shift control signal to the next emission control circuit through the shift control terminal NEXT. Since the shift control terminal NEXT is not connected to the wiring in the display area, on the one hand, a delay of the shift control signal caused by a wiring resistance and a coupling capacitance can be avoided, and on the other hand, a deviation of the shift control signal from its standard value caused by interference from the other wiring in the display area can also be avoided. Therefore, with the emission control circuit provided by the embodiments of the present disclosure, the influence of the wiring in the display area on the shift control signal can be avoided, such that the shift control signal can be stably transmitted to the starting signal terminal IN of the next emission control circuit and thus the next emission control circuit can operate normally, thereby achieving normal display of the image and thus improving the display quality.

Optionally, with further reference to FIG. 3, the first processing module 1 includes a first thin film transistor M1, a second thin film transistor M2, and a third thin film transistor M3.

A control electrode of the first thin film transistor M1 is electrically connected to the first control signal terminal CK, a first electrode of the first thin film transistor M1 is electrically connected to the first node N1, and a second electrode of the first thin film transistor M1 is electrically connected to the starting signal terminal IN. The first thin film transistor M1 controls the electrical connection of the first node N1 with the starting signal terminal IN according to the applied first control signal.

A control electrode of the second thin film transistor M2 is electrically connected to the second control signal terminal CKB, and a second electrode of the second thin film transistor M2 is electrically connected to the first node N1. The second thin film transistor M2 controls the electrical connection between the first node N1 and the second control signal terminal CKB according to the applied second control signal.

A control electrode of the third thin film transistor M3 is electrically connected to the second node N2, a first electrode of the third thin film transistor M3 is electrically connected to the first voltage signal terminal VGH, and a second electrode of the third thin film transistor M3 is electrically connected to the first electrode of the second thin film transistor M2. The third thin film transistor M3 controls the electrical connection of the first voltage signal terminal VGH with the first electrode of the second thin film transistor M2 according to the second signal applied to the second node N2.

Optionally, with further reference to FIG. 3, the second processing module 2 includes a fourth thin film transistor M4, a fifth thin film transistor M5, and a sixth thin film transistor M6.

A control electrode of the fourth thin film transistor M4 is electrically connected to the first node N1, and a second electrode of the fourth thin film transistor M4 is electrically connected to the first control signal terminal CK.

A control electrode of the fifth thin film transistor M5 is electrically connected to the first node N1, a first electrode of the fifth thin film transistor M5 is electrically connected to the second node N2, and a second electrode of the fifth thin film transistor M5 is electrically connected to a first electrode of the fourth thin film transistor M4. The fifth thin film transistor M5 controls the electrical connection of the second node N2 with the first electrode of the fourth thin film transistor M4 according to the first signal applied to the first node N1.

A control electrode of the sixth thin film transistor M6 is electrically connected to the first control signal terminal CK, a first electrode of the sixth thin film transistor M6 is electrically connected to the second node N2, and a second electrode of the sixth thin film transistor M6 is electrically connected to the second voltage signal terminal VGL. The sixth thin film transistor M6 controls the electrical connection of the second node N2 with the second voltage signal terminal VGL according to the applied first control signal.

Based on the connection manner of the fourth thin film transistor M4 and the fifth thin film transistor M5, the fourth thin film transistor M4 and the fifth thin film transistor M5 constitute a dual-gate transistor. For the dual-gate transistor, it has a large a channel length, i.e., a small width-length ratio $$\frac{W}{L}.$$

According to the leakage current formula of $$I = \frac{1}{2}\mu_n C_{ox} \frac{W}{L}(V_{gs} - |V_{th}|)^2,$$

the smaller the width-length ratio $$\frac{W}{L}$$

the smaller the leakage current of the transistor is and the lower the concentration of the active current carriers in the transistor is, thereby leading to the more stable performance of the transistor. Therefore, with this arrangement, based on a strong stability of the dual-gate transistor, the circuit operation stability can be improved to some extent.

In the above formula, I represents a leakage current, $\mu_n$ represents a migration rate of electrons, $C_{ox}$ represents a gate oxide capacitance per unit area, $$\frac{W}{L}$$

represents a channel width-length ratio, $V_{gs}$ represents a gate-source voltage, and $V_{th}$ represents a threshold voltage.

Optionally, the third processing module 3 includes a first capacitor C1, a seventh thin film transistor M7, an eighth thin film transistor M8, a ninth thin film transistor M9, and a second capacitor C2.

A first electrode of the first capacitor C1 is electrically connected to the second node N2, and a second electrode of the first capacitor C1 is electrically connected to the third node N3.

A control electrode of the seventh thin film transistor M7 is electrically connected to the second node N2. A first electrode of the seventh thin film transistor M7 is electrically connected to the third node N3, and a second electrode of the seventh thin film transistor M7 is electrically connected to the second control signal terminal CKB. The seventh thin film transistor M7 controls the electrical connection of the third node N3 with the second control signal terminal CKB according to the second signal applied to the second node N2.

A control electrode of the eighth thin film transistor M8 is electrically connected to the second control signal terminal CKB. A first electrode of the eighth thin film transistor M8 is electrically connected to the third node N3, and a second electrode of the eighth thin film transistor M8 is electrically connected to the fourth node N4. The eighth thin film transistor M8 controls the electrical connection of the third node N3 with the fourth node N4 according to the applied second control signal.

A control electrode of the ninth thin film transistor M9 is electrically connected to the first node N1. A first electrode of the ninth thin film transistor M9 is electrically connected to the first voltage signal terminal VGH, and a second electrode of the ninth thin film transistor M9 is electrically connected to the fourth node N4. The ninth thin film transistor M9 controls the electrical connection of the first voltage signal terminal VGH with the fourth node N4 according to the first signal applied to the first node N1.

A first electrode of the second capacitor C2 is electrically connected to the first voltage signal terminal VGH, and a second electrode of the second capacitor C2 is electrically connected to the fourth node N4. The second capacitor C2 serves as a storage capacitor and can hold the fourth signal of the fourth node N4, thereby achieving the normal operation of the output module 4.

Optionally, with further reference to FIG. 3, the output module 4 includes a tenth thin film transistor M10 and an eleventh thin film transistor M11.

A control electrode of the tenth thin film transistor M10 is electrically connected to the fourth node N4. A first electrode of the tenth thin film transistor M10 is electrically connected to the first voltage signal terminal VGH, and a second electrode of the tenth thin film transistor M10 is electrically connected to the output terminal OUT. The tenth thin film transistor M10 controls the electrical connection of the first voltage signal terminal VGH with the output terminal OUT according to the fourth signal applied to the fourth node N4. When the tenth thin film transistor M10 is switched on, the first voltage signal provided by the first voltage signal terminal VGH is transmitted to the output terminal OUT, such that the output terminal OUT outputs high level.

A control electrode of the eleventh thin film transistor M11 is electrically connected to the first node N1. A first electrode of the eleventh thin film transistor M11 is electrically connected to the output terminal OUT, and a second electrode of the eleventh thin film transistor M11 is electrically connected to the second voltage signal terminal VGL.

The eleventh thin film transistor M11 controls the electrical connection of the second voltage signal terminal VGL with the output terminal OUT according to the first signal applied to the first node N1. When the eleventh thin film transistor M11 is switched on, the second voltage signal provided by the second voltage signal terminal VGL is transmitted to the output terminal OUT, such that the output terminal OUT outputs low level.

In the following, the operation process of the emission control circuit will be described in detail by taking three structures of the shift control module 5 as examples.

First Structure

Optionally, with further reference to FIG. 3, the shift control module 5 includes a twelfth thin film transistor M12 and a thirteenth thin film transistor M13.

A control electrode of the twelfth thin film transistor M12 is electrically connected to the first node N1. A first electrode of the twelfth thin film transistor M12 is electrically connected to the shift control terminal NEXT, and a second electrode of the twelfth thin film transistor M12 is electrically connected to the second voltage signal terminal VGL. The twelfth thin film transistor M12 controls the electrical connection of the second voltage signal terminal VGL with the shift control terminal NEXT according to the first signal applied to the first node N1.

A control electrode of the thirteenth thin film transistor M13 is electrically connected to the fourth node N. A first electrode of the thirteenth thin film transistor M13 is electrically connected to the first node N1, and a second electrode of the thirteenth thin film transistor M13 is electrically connected to the shift control terminal NEXT. The thirteenth thin film transistor M13 controls the electrical connection of the first node N1 with the shift control terminal NEXT according to the fourth signal applied to the fourth node N4.

In the following, all the thin film transistors in the emission control circuit are P-type thin film transistors by way of example, and the driving method for the emission control circuit having the shift control module 5 in the first structure will be described in detail with reference to FIG. 3 and FIG. 4.

In the first period t1, the starting signal terminal IN provides low level, the first control signal terminal CK provides low level, and the second control signal terminal CKB provides high level. Low level provided by the starting signal terminal IN is transmitted to the first node N1 through the switched-on first thin film transistor M1. Low level provided by the first control signal terminal CK is transmitted to the second node N2 through the switched-on fourth thin film transistor M4 and fifth thin film transistor M5. Low level provided by the second voltage signal terminal VGL is transmitted to the second node N2 through the switched-on sixth thin film transistor M6. High level provided by the second control signal terminal CKB is transmitted to the third node N3 through the switched-on seventh thin film transistor M7. High level provided by the first voltage signal terminal VGH is transmitted to the fourth node N4 through the switched-on ninth thin film transistor M9. Low level provided by the second voltage signal terminal VGL is transmitted to the output terminal OUT through the switched-on eleventh thin film transistor M11, that is, the output terminal OUT outputs low level. Low level provided by the second voltage signal terminal VGL is transmitted to the shift control terminal NEXT through the switched-on twelfth thin film transistor M12, that is, the shift control terminal NEXT outputs low level.

In the second period t2, the starting signal terminal IN provides low level, the first control signal terminal CK provides high level, and the second control signal terminal CKB provided low level. The first node N1 maintains at low level, high level provided by the first control signal terminal CK is transmitted to the second node N2 through the switched-on fourth thin film transistor M4 and fifth thin film transistor M5. The third node N3 maintains at high level. The four-node N4 maintains at high level. The output terminal OUT maintains low level output. The shift control terminal NEXT maintains low level output.

In the third period t3, the starting signal terminal IN provides high level, the first control signal terminal CK provides low level, and the second control signal terminal CKB provides high level. Low level provided by the second voltage signal terminal VGL is transmitted to the second node N2 through the switched-on sixth thin film transistor M6. High level provided by the first voltage signal terminal VGH is transmitted to the first node N1 through the switched-on third thin film transistor M3 and second thin film transistor M2. High level provided by the second control signal terminal CKB is transmitted to the third node N3 through the switched-on seventh thin film transistor M7. The fourth node N4 maintains at high level. The output terminal OUT maintains low level output. The shift control terminal NEXT maintains low level output.

In the fourth period t4, the starting signal terminal IN provides high level, the first control signal terminal CK provides high level, and the second control signal terminal CKB provides low level. The first node N1 maintains at high level. The second node N2 maintains at low level. Low level provided by the second control signal terminal CKB is transmitted to the third node N3 through the switched-on seventh thin film transistor M7. Low level at the third node N3 is transmitted to the fourth node N4 through the switched-on eighth thin film transistor M8. High level provided by the voltage signal terminal VGH is transmitted to the output terminal OUT through the switched-on tenth thin film transistor M10, such that the output terminal OUT outputs high level. High level at the first node N1 is transmitted to the shift control terminal NEXT though the switched-on thirteenth thin film transistor M13, such that the shift control terminal NEXT outputs high level.

In the fifth period t5, the start signal terminal IN provides high level. The first control signal terminal CK provides low level. The second control signal terminal CKB provides high level. The first node N1 maintains at high level. The second node N2 maintains at low level. High level provided by the second control signal terminal CKB is transmitted to the third node N3 through the switched-on seventh thin film transistor M7. The fourth node N4 maintains at low level. The output terminal OUT maintains high level output. High level at the first node N1 is transmitted to the shift control terminal NEXT though the switched-on thirteenth thin film transistor M13, such that the shift control terminal NEXT maintains high level output.

Second Structure

Figure 5:
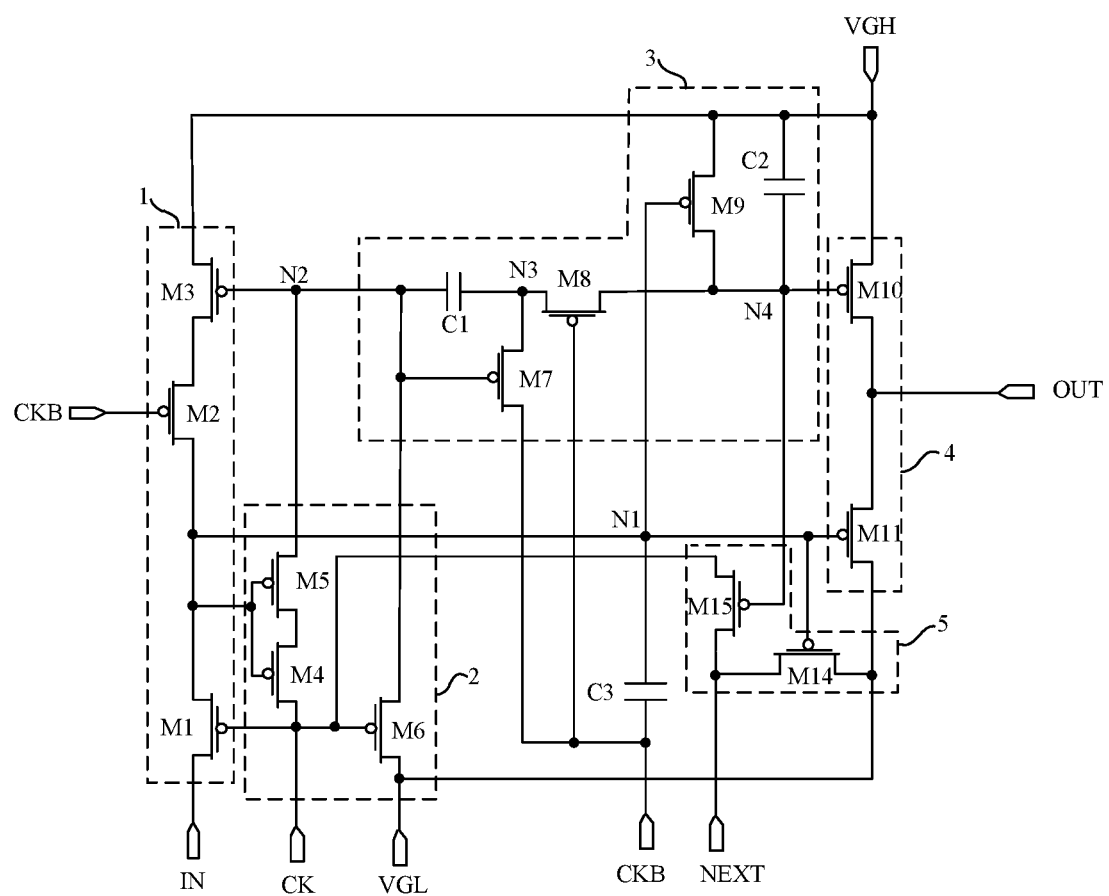
FIG. 5 is another structural schematic diagram of an emission control circuit according to an embodiment of the present disclosure.

Optionally, as shown in FIG. 5, which is another structural schematic diagram of an emission control circuit according to an embodiment of the present disclosure, the shift control module 5 includes a fourteenth thin film transistor M14 and a fifteenth thin film transistor M15.

A control electrode of the fourteenth thin film transistor M14 is electrically connected to the first node N1. A first electrode of the fourteenth thin film transistor M14 is electrically connected to the shift control terminal NEXT, and a second electrode of the fourteenth thin film transistor M14 is electrically connected to the second voltage signal terminal VGL. The fourteenth thin film transistor M14 controls the electrical connection of the shift control terminal NEXT with the second voltage signal terminal VGL according to the first signal applied to the first node N1.

A control electrode of the fifteenth thin film transistor M15 is electrically connected to the fourth node N4. A first electrode of the fifteenth thin film transistor M15 is electrically connected to the first control signal terminal CK, and a second electrode of the fifteenth thin film transistor M15 is electrically connected to the shift control terminal NEXT. The fifteenth thin film transistor M15 controls the electrical connection of the shift control terminal NEXT with the first control signal terminal CK according to the fourth signal applied to the fourth node N4.

In the following, all the thin film transistors in the emission control circuit are P-type thin film transistors by way of example, and the driving method for the emission control circuit having the shift control module 5 in the second structure will be described in detail with reference to FIG. 5 and FIG. 6, which is a signal sequence diagram corresponding to FIG. 5.

In the first period t1 to the third period t3, the operation process of the emission control circuit is the same as the operation process of the emission control circuit having the shift control module 5 in the first structure, which will not be further described herein.

In the fourth period t4, the starting signal terminal IN provides high level, the first control signal terminal CK provides high level, and the second control signal terminal CKB provides low level. The first node N1 maintains at high level. The second node N2 maintains at low level. Low level provided by the second control signal terminal CKB is transmitted to the third node N3 through the switched-on seventh thin film transistor M7. Low level at the third node N3 is transmitted to the fourth node N4 through the switched-on eighth thin film transistor M8. High level provided by the first voltage signal terminal VGH is transmitted to the output terminal OUT through the switched-on tenth thin film transistor M10, such that the output terminal OUT outputs high level. High level provided by the first control signal terminal CK is transmitted to the shift control terminal NEXT through the switched-on fifteenth thin film transistor M15, such that the shift control terminal NEXT outputs high level.

In the fifth period t5, the start signal terminal IN provides high level, the first control signal terminal CK provides low level, and the second control signal terminal CKB provides high level. The first node N1 maintains at high level. The second node N2 maintains at low level. High level provided by the second control signal terminal CKB is transmitted to the third node N3 through the switched-on seventh thin film transistor M7. The fourth node N4 maintains at low level. The output terminal OUT maintains high level output. Low level provided by the first control signal terminal CK is transmitted to the shift control terminal NEXT through the switched-on fifteenth thin film transistor M15, such that the shift control terminal NEXT outputs low level.

In the emission control circuit having the shift control module 5 in the first structure, the shift control terminal NEXT of the emission control circuit outputs high level in the fifth period t5. In the emission control circuit having the shift control module 5 in the second structure, the shift control terminal NEXT of the emission control circuit outputs low level in the fifth period t5. Since the shift control signal outputted by the shift control terminal NEXT of the emission control circuit in the fifth period t5 is a starting signal received by the starting signal terminal IN of the next emission control circuit in the fourth period t4, in combination with the above analysis of the operation process of the emission control circuit in the fourth period t4, it can be known that in the fourth period t4, the first thin film transistor M1 is switched off under high level provided by the first control signal terminal CK, such that the signal provided by the starting signal terminal IN cannot be transmitted to the first node N1. That is, in the fourth period t4, no matter whether the signal provided by the starting signal terminal IN is high level or low level, it will not be transmitted to the first node N1. Therefore, whether the shift control terminal NEXT of the emission control circuit outputs high level or low level in the fifth period t5 will not the influence normal operation of the circuit.

Further, in the abovementioned shift control module 5, the first electrode of the fifteenth thin film transistor M15 is electrically connected to the first control signal terminal CK. Since the first control signal terminal CK is directly connected to the driving chip through the clock signal line, the signal received by the first electrode of the fifteenth thin film transistor M15 is provided by the driving chip. Compared with signals of some nodes in the circuit, the signal directly provided by the driving chip has the stronger stability and will not be easily interfered by other signals. Therefore, with the electrical connection between the first electrode of the fifteenth thin film transistor M15 and the first control signal terminal CK, the shift control terminal NEXT can receive a stable low-level signal in the fourth period t4.

Third Structure

Figure 7:
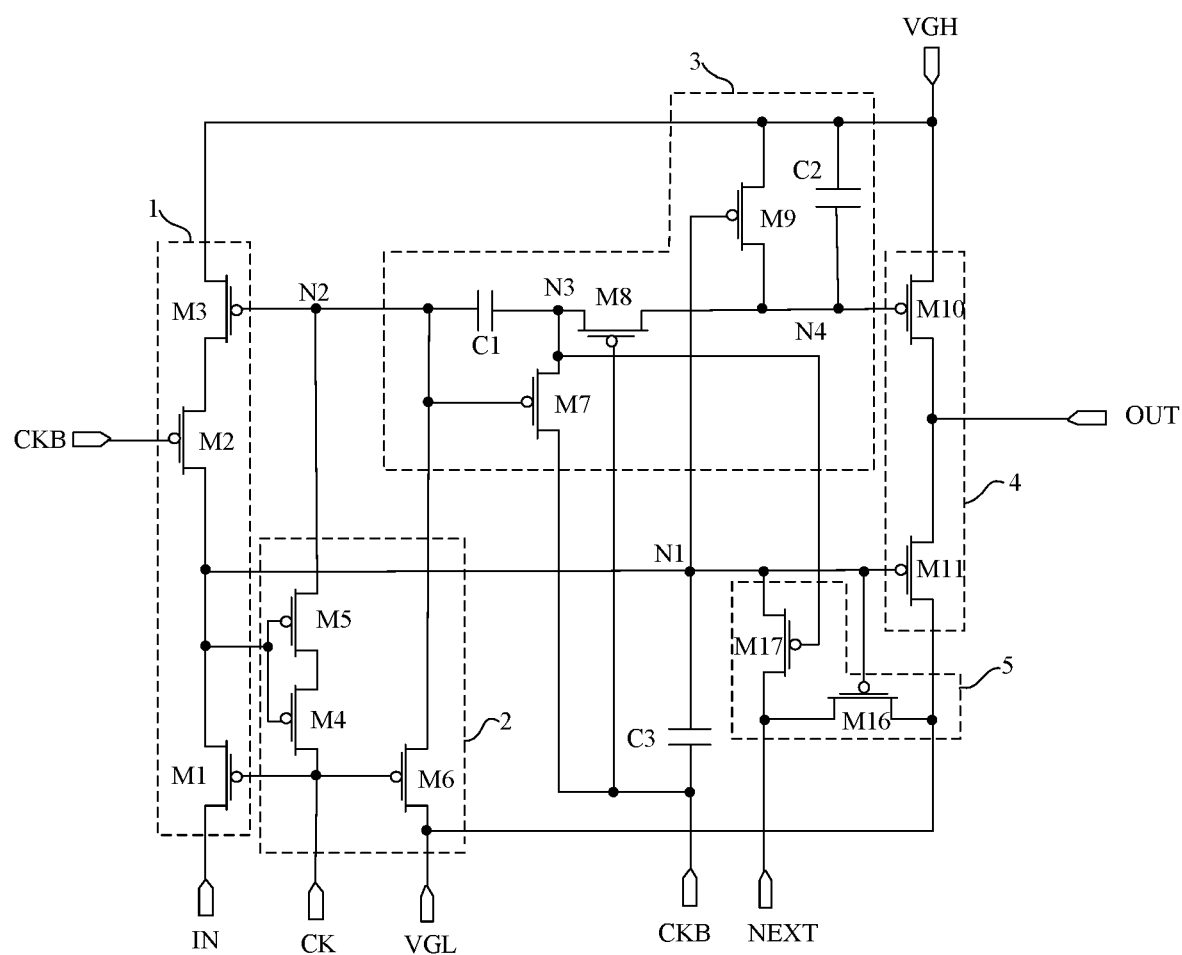
FIG. 7 is still another structural schematic diagram of an emission control circuit according to an embodiment of the present disclosure.

Optionally, as shown in FIG. 7, which is still another structural schematic diagram of an emission control circuit according to an embodiment of the present disclosure, the shift control module 5 includes a sixteenth thin film transistor M16 and a seventeenth thin film transistor M17.

A control electrode of the sixteenth thin film transistor M16 is electrically connected to the first node N1. A first electrode of the sixteenth thin film transistor M16 is electrically connected to the shift control terminal NEXT. A second electrode of the sixteenth thin film transistor M16 is electrically connected to the second voltage signal terminal VGL. The sixteenth thin film transistor M16 controls the electrical connection of the shift control terminal NEXT with the second voltage signal terminal VGL according to the first signal applied to the first node N1.

A control electrode of the seventeenth thin film transistor M17 is electrically connected to the third node N3. A first electrode of the seventeenth thin film transistor M17 is electrically connected to the first node N1. A second electrode of the seventeenth thin film transistor M17 is electrically connected to the shift control terminal NEXT. The seventeenth thin film transistor M17 controls the electrical connection of the shift control terminal NEXT with the first node N1 according to the third signal applied to third node N3.

In the following, all the thin film transistors in the emission control circuit are P-type thin film transistors by way of example, and the driving method for the emission control circuit having the shift control module 5 in the third structure will be described in detail with reference to FIG. 5 and FIG. 3.

In the first period t1 to the third period t3, the operation process of the emission control circuit is the same as the operation process of the emission control circuit having the shift control module 5 in the first structure, which will not be further described herein.

In the fourth period t4, the starting signal terminal IN provides high level. The first control signal terminal CK provides high level. The second control signal terminal CKB provides low level. The first node N1 maintains at high level. The second node N2 maintains at low level. Low level provided by the second control signal terminal CKB is transmitted to the third node N3 through the switched-on seventh thin film transistor M7. Low level at the third node N3 is transmitted to the fourth node N4 through the switched-on eighth thin film transistor M8. High level provided by the first voltage signal terminal VGH is transmitted to the output terminal OUT through the switched-on tenth thin film transistor M10, such that the output terminal OUT outputs high level. High level at the first node N1 is transmitted to the shift control terminal NEXT through the switched-on seventeenth thin film transistor M17, such that the shift control terminal NEXT outputs high level.

In the fifth period t5, the start signal terminal IN provides high level. The first control signal terminal CK provides low level. The second control signal terminal CKB provides high level. The first node N1 maintains at high level. The second node N2 maintains at low level. High level provided by the second control signal terminal CKB is transmitted to the third node N3 through the switched-on seventh thin film transistor M7. The fourth node N4 maintains at low level. The output terminal OUT maintains at high level. The shift control terminal NEXT maintains high level output.

With further reference to FIG. 3, FIG. 5 and FIG. 7, the emission control circuit further includes a third capacitor C3. A first electrode of the third capacitor C3 is electrically connected to the first node N1, and a second electrode of the third capacitor C3 is electrically connected to the second control signal terminal CKB. When the emission control circuit includes the third capacitor C3, in the second period t2, the third capacitor C3 can pull down the potential of the first node N1 under low level provided by the second control signal terminal CKB, and thus making the potential of the first node N1 be lower. This can allow the eleventh thin film transistor M11 to be switched on more completely, and thus low level provided by the second voltage signal terminal VGL can be better transmitted to the output terminal OUT.

An embodiment of the present disclosure further provides a driving method for an emission control circuit, and the driving method for the emission control circuit is applied to the abovementioned emission control circuit.

With reference to FIG. 3 to FIG. 7, the driving method for the emission control circuit includes the following steps.

In the first period t1, the starting signal terminal IN provides low level. The first control signal terminal CK provides low level. The second control signal terminal CKB provides high level. The first processing module 1 generates low level to the first node N1 in response to low level provided by the first control signal terminal CK. The second processing module 2 generates low level to the second node N2 in response to low level provided by the first control signal terminal CK and low level at the first node N1. The third processing module 3 generates high level to the third node N3 and generates high level to the fourth node N4 in response to low level at the second node N2 and low level at the first node N1. The output module 4 causes the output terminal OUT to output low level in response to low level at the first node N1. The shift control module 5 causes the shift control terminal NEXT to output low level in response to the first signal.

In the second period t2, the starting signal terminal IN provides low level. The first control signal terminal CK provides high level. The second control signal terminal CKB provides low level. The first node N1 maintains at low level. The second processing module 2 generates high level to the second node N2 in response to low level at the first node N1. The third node N3 maintains at high level. The fourth node N4 maintains at high level. The output terminal OUT maintains low level output. The shift control terminal NEXT maintains low level output.

In the third period t3, the starting signal terminal IN provides high level. The first control signal terminal CK provides low level. The second control signal terminal CKB provides high level. The first processing module 1 generates high level to the first node N1 in response to low level provided by the first control signal terminal CK. The second processing module 2 generates low level to the second node N2 in response to low level provided by the first control signal terminal CK. The third processing module 3 generates high level to the third node N3 in response to low level at the second node N2. The fourth node N4 maintains at high level. The output terminal OUT maintains low level output. The shift control terminal NEXT maintains low level output.

In the fourth period t4, the starting signal terminal IN provides high level. The first control signal terminal CK provides high level. The second control signal terminal CKB provides low level. The first node N1 maintains at high level. The second node N2 maintains at low level. The third processing module 3 generates low level to the third node N3 and generates low level to the fourth node N4 in response to low level at the second node N2 and low level provided by the second control signal terminal CKB. The output module 4 causes the output terminal OUT to output high level in response to low level at the fourth node N4. The shift control module 5 causes the shift control terminal NEXT to output high level in response to low level at the third node N3 or the fourth node N4.

In the fifth period t5, the starting signal terminal IN provides high level. The first control signal terminal CK provides low level. The second control signal terminal CKB provides high level. The first node N1 maintains at high level. The second node N2 maintains at low level. The third processing module 3 generates high level to the third node N3 in response to low level at the second node N2. The fourth node N4 maintains at low level. The output module 4 maintains high level output. The shift control module 5 causes the shift control terminal NEXT to output high level in response to low level at the third node N3, or, the shift control module 5 causes the shift control terminal NEXT to output high level or low level in response to low level at the fourth node N4.

The driving process for the emission control circuit has been described in detail with reference to the above embodiments, and will not be further described herein.

With the driving method for the emission control circuit provided by the embodiments of the present disclosure, the shift control signal is outputted to a next emission control circuit by the shift control terminal NEXT of the emission control circuit. Since the shift control terminal NEXT is not connected to the wirings in the display area, the influence of the wirings in the display area on the shift control signal can be avoided, such that the shift control signal can be stably transmitted to the starting signal terminal IN of the next emission control circuit and thus the next emission control circuit can operate normally, thereby achieving normal display of the image and improving the display quality.

In combination with FIG. 3 and FIG. 4, when the shift control module 5 includes the twelfth thin film transistor M12 and the thirteenth thin film transistor M13, in the fourth period t4, controlling, by the shift control module 5, the shift control terminal NEXT to output high level in response to low level at the fourth node N4 includes: in the fourth period t4, switching on the thirteenth thin film transistor M13 on under low level at the fourth node N4, and transmitting high level at the first signal to the shift control terminal NEXT, such that the shift control terminal NEXT outputs high level.

In the fifth period t5, controlling, by the shift control module 5, the shift control terminal NEXT to output high level in response to low level at the fourth node N4 includes: in the fifth period t5, switching on the thirteenth thin film transistor M13 under low level at the fourth node N4, and transmitting high level at the first node N1 to the shift control terminal NEXT, such that the shift control terminal NEXT outputs high level.

Figure 6:
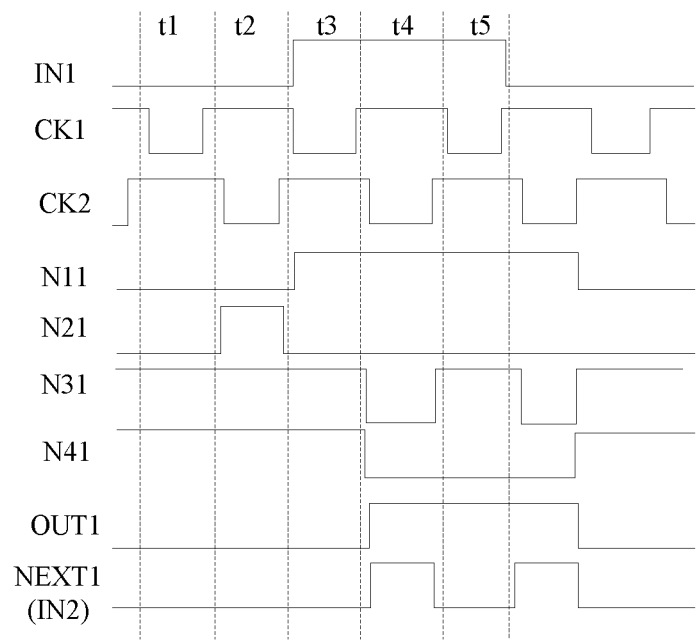
FIG. 6 is a signal sequence diagram corresponding to FIG. 5.

In combination with FIG. 5 and FIG. 6, when the shift control module 5 includes the fourteenth thin film transistor M14 and the fifteenth thin film transistor M15, in the fourth period t4, controlling, by the shift control module 5, the shift control terminal NEXT to output high level in response to low level at the fourth node N4 includes: in the fourth period t4, switching on the fifteenth thin film transistor M15 on under low level at the fourth node N4, and transmitting high level provided by the first control signal terminal CK to the shift control terminal NEXT, such that the shift control terminal NEXT outputs high level.

In the fifth period t5, controlling, by the shift control module 5, the shift control terminal NEXT to output low level in response to low level at the fourth node N4 includes: in the fifth period t5, switching on the fifteenth thin film transistor M15 under low level at the fourth node N4, and transmitting low level provided by the first control signal terminal CK to the shift control terminal NEXT, such that the shift control terminal NEXT outputs low level.

In combination with FIG. 7 and FIG. 3, when the shift control module 5 includes the sixteenth thin film transistor M16 and the seventeenth thin film transistor M17, in the fourth period t4, controlling, by the shift control module 5, the shift control terminal NEXT to output high level in response to low level at the third node N3 includes: in the third period t3, switching on the seventeenth thin film transistor M17 under low level at the third node N3, and transmitting high level at the first node N1 to the shift control terminal NEXT, such that the shift control terminal NEXT outputs high level.

The operation principle of the shift control modules 5 with different structures has been described in detail in the above embodiments, and will not be further described herein.

Figure 8:
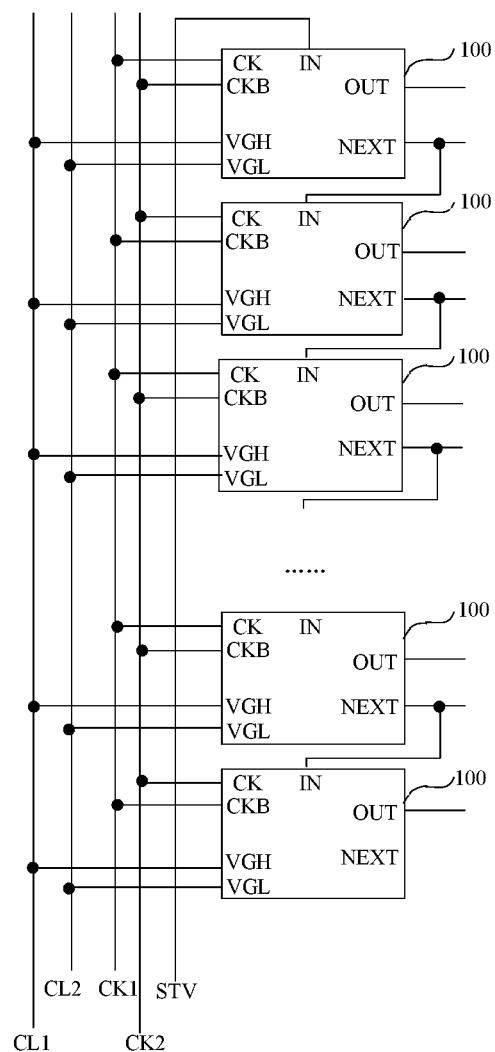
FIG. 8 is a structural schematic diagram of an emission controller according to an embodiment of the present disclosure.

An embodiment of the present disclosure further provides an emission controller. As shown in FIG. 8, which is a structural schematic diagram of an emission controller according to an embodiment of the present disclosure, the emission controller includes a plurality of cascaded emission control circuits 100 as described above. Among the plurality of emission control circuits 100, the shift control terminal NEXT of an emission control circuit 100 is electrically connected to the starting signal terminal IN of a next emission control circuit 100.

Since the emission controller provided by the embodiment of the present disclosure includes the abovementioned emission control circuit 100, with the emission controller, the influence of the wiring in the display area on the shift control signal will be avoided, such that the shift control signal can be stably transmitted to the starting signal terminal IN of the next emission control circuit 100 and thus the next emission control circuit 100 can operate normally, thereby achieving normal display of the image and improving the display quality.

It should be understood that the shift control terminal NEXT of a first emission control circuit 100 can be electrically connected to a frame starting signal line STV. When it is needed to drive the first control circuit 100 to operate, the frame starting signal line STV provides a starting signal to the starting signal terminal IN of the first emission control circuit 100.

In addition, with further reference to FIG. 8, among the plurality of cascaded emission control circuits 100, the first control signal terminal CK of each odd-numbered stage of emission control circuits 100 is electrically connected to the first clock signal line CK1, and the second control signal terminal CKB is electrically connected to the second clock signal line CK2; the first control signal terminal CK of each even-numbered emission control circuit 100 is electrically connected to the second clock signal line CK2, and the second control signal terminal CKB is electrically connected to the first clock signal line CK1.

In addition, with further reference to FIG. 8, the first voltage signal terminal VGH in the emission control circuit 100 can be connected to a driving chip (not shown in the figure) through the first voltage signal line CL1, and the second voltage signal terminal VGL can be connected to the driving chip through the second voltage signal line CL2.

Figure 9:
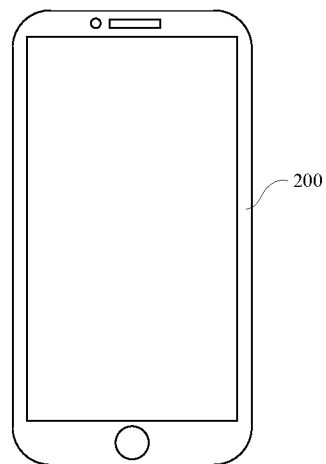
FIG. 9 is a structural schematic diagram of a display device according to an embodiment of the present disclosure.

An embodiment of the present disclosure further provides a display device. As shown in FIG. 9, which is a structural schematic diagram of a display device according to an embodiment of the present disclosure, the display device includes the abovementioned emission controller 200. The structure of the emission controller 200 has been described in detail in the above embodiments, and will not be further described herein. It should be noted that, the display device shown in FIG. 9 is merely illustrative, and the display device can be any electronic device having a display function, such as a cellphone, a tablet computer, a notebook computer, an electronic paper book, or a television, etc.

Since the display device provided by the embodiment of the present disclosure includes the abovementioned emission controller 200, with the display device, the influence of the wiring in the display area on the shift control signal can be avoided, such that the shift control signal can be stably transmitted to the starting signal terminal of the next emission control circuit and thus the next emission control circuit can operate normally, thereby achieving normal display of the image and improving the display quality.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. An emission controller, comprising one or more emission control circuits, wherein each of the one or more emission control circuits comprises:
   a first processing module electrically connected to a starting signal terminal, a first voltage signal terminal, a first control signal terminal and a second control signal terminal and configured to generate a first signal to a first node in response to a first control signal, a second control signal and a second signal;
   a second processing module electrically connected to the first control signal terminal and a second voltage signal terminal and configured to generate the second signal to a second node in response to the first control signal and the first signal;
   a third processing module electrically connected to the second control signal terminal and the first voltage signal terminal and configured to generate a third signal to a third node and generate a fourth signal to a fourth node in response to the second control signal, the second signal and the first signal;

an output module electrically connected to the first voltage signal terminal, the second voltage signal terminal and an output terminal and configured to provide an emission control signal to the output terminal in response to the first signal and the fourth signal; and a shift control module electrically connected to the first voltage signal terminal and a shift control terminal, and configured to provide a shift control signal to the shift control terminal in response to the first signal and the fourth signal or to provide a shift control signal to the shift control terminal in response to first signal and the third signal, wherein in a first period in which the starting signal terminal provides low level, the first control signal terminal provides low level and the second control signal terminal provides high level, generating, by the first processing module, low level to the first node in response to low level provided by the first control signal terminal, generating, by the second processing module, low level to the second node in response to low level provided by the first control signal terminal and low level at the first node, generating, by the third processing module, high level to the third node and high level to the fourth node in response to low level at the second node and low level at the first node, controlling, by the output module, the output terminal to output low level in response to low level at the first node, and controlling, by the shift control module, the shift control terminal to output low level in response to the first signal;

in a second period in which the starting signal terminal provides low level, the first control signal terminal provides high level, the second control signal terminal provides low level, and the first node is maintained at low level, generating, by the second processing module, high level to the second node in response to low level at the first node, maintaining high level at the third node, maintaining high level at the fourth node, maintaining low level output at the output terminal, and maintaining low level output at the shift control terminal;

in a third period in which the starting signal terminal provides high level, the first control signal terminal provides low level, and the second control signal terminal provides high level, generating, by the first processing module, high level to the first node in response to low level provided by the first control signal terminal, generating, by the second processing module, low level to the second node in response to low level provided by the first control signal terminal, generating, by the third processing module, high level to the third node in response to low level at the second node, maintaining high level at the fourth node, maintaining low level output at the output terminal, and maintaining low level output at the shift control terminal;

in a fourth period in which the starting signal terminal provides high level, the first control signal terminal provides high level, the second control signal terminal provides low level, and the first node is maintained at high level and the second node is maintained at high level, generating, by the third processing module, low level to the third node and low level to the fourth node in response to low level at the second node and low level provided by the second control signal terminal, controlling, by the output module, the output terminal to output high level in response to low level at the fourth node, and controlling, by the shift control module, the shift control terminal to output high level in response to low level at the third node or the fourth node; and in a fifth period, the starting signal terminal provides high level, the first control signal terminal provides low level, the second control signal terminal provides high level, and the first node is maintained at high level and the second node is maintained at low level, generating, by the third processing module, high level to the third node in response to low level at the second node, maintaining low level at the fourth node, maintaining high level output at the output module, controlling, by the shift control module, the shift control terminal to output high level in response to low level at the third node, or controlling, by the shift control module, the shift control terminal to output high level or low level in response to low level at the fourth node, wherein the shift control module comprises:

a sixteenth thin film transistor having a control electrode electrically connected to the first node, a first electrode electrically connected to the shift control terminal, and a second electrode electrically connected to the second voltage signal terminal; and a seventeenth thin film transistor having a control electrode electrically connected to the third node, a first electrode electrically connected to the first node, and a second electrode electrically connected to the shift control terminal, wherein controlling, by the shift control module, the shift control terminal to output high level in response to low level at the third node in the fourth period comprises:
in the fourth period, switching on the seventeenth thin film transistor under low level at the third node, and transmitting high level at the first node to the shift control terminal, such that the shift control terminal outputs high level.

2. The emission controller according to claim 1, wherein the first processing module comprises:

a first thin film transistor having a control electrode electrically connected to the first control signal terminal, a first electrode electrically connected to the first node, and a second electrode electrically connected to the starting signal terminal;

a second thin film transistor having a control electrode electrically connected to the second control signal terminal, a first electrode, and a second electrode electrically connected to the first node; and a third thin film transistor having a control electrode electrically connected to the second node, a first electrode electrically connected to the first voltage signal terminal, and a second electrode electrically connected to the first electrode of the second thin film transistor.

3. The emission controller according to claim 1, wherein the second processing module comprises:

a fourth thin film transistor having a control electrode electrically connected to the first node, a first electrode, and a second electrode electrically connected to the first control signal terminal;

a fifth thin film transistor having a control electrode electrically connected to the first node, a first electrode electrically connected to the second node, and a second electrode electrically connected to the first electrode of the fourth thin film transistor; and a sixth thin film transistor having a control electrode electrically connected to the first control signal terminal, a first electrode electrically connected to the second node, and a second electrode electrically connected to the second voltage signal terminal.

4. The emission controller according to claim 1, wherein the third processing module comprises:
a first capacitor having a first electrode electrically connected to the second node and a second electrode electrically connected to the third node;
a seventh thin film transistor having a control electrode electrically connected to the second node, a first electrode electrically connected to the third node, and a second electrode electrically connected to the second control signal terminal;
an eighth thin film transistor having a control electrode electrically connected to the second control signal terminal, a first electrode electrically connected to the third node, and a second electrode electrically connected to the fourth node;
a ninth thin film transistor having a control electrode electrically connected to the first node, a first electrode electrically connected to the first voltage signal terminal, and a second electrode electrically connected to the fourth node; and
a second capacitor having a first electrode electrically connected to the first voltage signal terminal and a second electrode electrically connected to the fourth node.

5. The emission controller according to claim 1, wherein the output module comprises:
a tenth thin film transistor having a control electrode electrically connected to the fourth node, a first electrode electrically connected to the first voltage signal terminal, and a second electrode electrically connected to the output terminal; and
an eleventh thin film transistor having a control electrode electrically connected to the first node, a first electrode electrically connected to the output terminal, and a second electrode electrically connected to the second voltage signal terminal.

6. The emission controller according to claim 1, further comprising:
a third capacitor having a first electrode electrically connected to the first node and a second electrode electrically connected to the second control signal terminal.

7. The emission controller according to claim 1, wherein the one or more emission control circuits comprise a plurality of cascaded emission control circuits, wherein among the plurality of cascaded emission control circuits, the shift control terminal of an emission control circuit is electrically connected to the starting signal terminal of a next emission control circuit.

8. The emission controller according to claim 7,
wherein among the plurality of cascaded emission control circuits, the first control signal terminal of each odd-numbered stage of emission control circuit is electrically connected to a first clock signal line, and the second control signal terminal of each odd-numbered stage of emission control circuit is electrically connected to a second clock signal line; and the first control signal terminal of each even-numbered stage of emission control circuit is electrically connected to the second clock signal line, and the second control signal terminal of each even-numbered stage of emission control circuit is electrically connected to the first clock signal line.

9. A driving method for an emission controller, wherein the emission controller comprises:
a first processing module electrically connected to a starting signal terminal, a first voltage signal terminal, a first control signal terminal and a second control signal terminal and configured to generate a first signal to a first node in response to a first control signal, a second control signal and a second signal;
a second processing module electrically connected to the first control signal terminal and a second voltage signal terminal and configured to generate the second signal to a second node in response to the first control signal and the first signal;
a third processing module electrically connected to the second control signal terminal and the first voltage signal terminal and configured to generate a third signal to a third node and generate a fourth signal to a fourth node in response to the second control signal, the second signal and the first signal;
an output module electrically connected to the first voltage signal terminal, the second voltage signal terminal and an output terminal and configured to provide an emission control signal to the output terminal in response to the first signal and the fourth signal; and
a shift control module electrically connected to the first voltage signal terminal and a shift control terminal, and configured to provide a shift control signal to the shift control terminal in response to the first signal and the fourth signal or to provide a shift control signal to the shift control terminal in response to first signal and the third signal,
wherein the driving method for the emission controller comprises steps of:
in a first period in which the starting signal terminal provides low level, the first control signal terminal provides low level and the second control signal terminal provides high level, generating, by the first processing module, low level to the first node in response to low level provided by the first control signal terminal, generating, by the second processing module, low level to the second node in response to low level provided by the first control signal terminal and low level at the first node, generating, by the third processing module, high level to the third node and high level to the fourth node in response to low level at the second node and low level at the first node, controlling, by the output module, the output terminal to output low level in response to low level at the first node, and controlling, by the shift control module, the shift control terminal to output low level in response to the first signal;
in a second period in which the starting signal terminal provides low level, the first control signal terminal provides high level, the second control signal terminal provides low level, and the first node is maintained at low level, generating, by the second processing module, high level to the second node in response to low level at the first node, maintaining high level at the third node, maintaining high level at the fourth node, maintaining low level output at the output terminal, and maintaining low level output at the shift control terminal;
in a third period in which the starting signal terminal provides high level, the first control signal terminal provides low level, and the second control signal terminal provides high level, generating, by the first processing module, high level to the first node in response to low level provided by the first control signal terminal, generating, by the second processing module, low level to the second node in response to low level provided by the first control signal terminal, generating, by the third processing module, high level to the third node in response to low level at the second node, maintaining high level at the fourth node, maintaining low level output at the output terminal, and maintaining low level output at the shift control terminal;

in a fourth period in which the starting signal terminal provides high level, the first control signal terminal provides high level, the second control signal terminal provides low level, and the first node is maintained at high level and the second node is maintained at low level, generating, by the third processing module, low level to the third node and low level to the fourth node in response to low level at the second node and low level provided by the second control signal terminal, controlling, by the output module, the output terminal to output high level in response to low level at the fourth node, and controlling, by the shift control module, the shift control terminal to output high level in response to low level at the third node or the fourth node; and in a fifth period, the starting signal terminal provides high level, the first control signal terminal provides low level, the second control signal terminal provides high level, and the first node is maintained at high level and the second node is maintained at low level, generating, by the third processing module, high level to the third node in response to low level at the second node, maintaining low level at the fourth node, maintaining high level output at the output module, controlling, by the shift control module, the shift control terminal to output high level in response to low level at the third node, or controlling, by the shift control module, the shift control terminal to output high level or low level in response to low level at the fourth node, wherein the shift control module comprises: a sixteenth thin film transistor having a control electrode electrically connected to the first node, a first electrode electrically connected to the shift control terminal, and a second electrode electrically connected to the second voltage signal terminal; and a seventeenth thin film transistor having a control electrode electrically connected to the third node, a first electrode electrically connected to the first node, and a second electrode electrically connected to the shift control terminal, wherein controlling, by the shift control module, the shift control terminal to output high level in response to low level at the third node in the fourth period comprises: in the fourth period, switching on the seventeenth thin film transistor under low level at the third node, and transmitting high level at the first node to the shift control terminal, such that the shift control terminal outputs high level.

10. The driving method for the emission controller according to claim 9, wherein the shift control module comprises: a twelfth thin film transistor having a control electrode electrically connected to the first node, a first electrode electrically connected to the shift control terminal, and a second electrode electrically connected to the second voltage signal terminal; and a thirteenth thin film transistor having a control electrode electrically connected to the fourth node, a first electrode electrically connected to the first node, and a second electrode electrically connected to the shift control terminal, in the fourth period, controlling, by the shift control module, the shift control terminal to output high level in response to low level at the fourth node comprises: in the fourth period, switching on the thirteenth thin film transistor under low level at the fourth node, and transmitting high level at the first node to the shift control terminal, such that the shift control terminal outputs high level; and in the fifth period, controlling, by the shift control module, the shift control terminal to output high level in response to low level at the fourth node comprises: in the fifth period, switching on the thirteenth thin film transistor under low level at the fourth node, and transmitting high level at the first node to the shift control terminal, such that the shift control terminal outputs high level.

11. The driving method for the emission controller according to claim 9, wherein the shift control module comprises: a fourteenth thin film transistor having a control electrode electrically connected to the first node, a first electrode electrically connected to the shift control terminal, and a second electrode electrically connected to the second voltage signal terminal; and a fifteenth thin film transistor having a control electrode electrically connected to the fourth node, a first electrode electrically connected to the first control signal terminal, and a second electrode electrically connected to the shift control terminal, wherein controlling, by the shift control module, the shift control terminal to output high level in response to low level at the fourth node in the fourth period comprises: in the fourth period, switching on the fifteenth thin film transistor under low level at the fourth node, and transmitting high level provided by the first control signal terminal to the shift control terminal, such that the shift control terminal outputs high level; and wherein controlling, by the shift control module, the shift control terminal to output low level in response to low level at the fourth node in the fifth period comprises: in the fifth period, switching on the fifteenth thin film transistor under low level at the fourth node, and transmitting low level provided by the first control signal terminal to the shift control terminal, such that the shift control terminal outputs low level.

12. A display device, comprising an emission controller, wherein the emission controller comprises one or more emission control circuits, and each of the one or more emission control circuits comprises:

a first processing module electrically connected to a starting signal terminal, a first voltage signal terminal, a first control signal terminal and a second control signal terminal and configured to generate a first signal to a first node in response to a first control signal, a second control signal and a second signal;

a second processing module electrically connected to the first control signal terminal and a second voltage signal terminal and configured to generate the second signal to a second node in response to the first control signal and the first signal;

a third processing module electrically connected to the second control signal terminal and the first voltage signal terminal and configured to generate a third signal to a third node and generate a fourth signal to a fourth node in response to the second control signal, the second signal and the first signal;
an output module electrically connected to the first voltage signal terminal, the second voltage signal terminal and an output terminal and configured to provide an emission control signal to the output terminal in response to the first signal and the fourth signal; and
a shift control module electrically connected to the first voltage signal terminal and a shift control terminal, and configured to provide a shift control signal to the shift control terminal in response to the first signal and the fourth signal or to provide a shift control signal to the shift control terminal in response to first signal and the third signal,
wherein the one or more emission control circuits comprise a plurality of cascaded emission control circuits, and among the plurality of cascaded emission control circuits, the shift control terminal of an emission control circuit is electrically connected to the starting signal terminal of a next emission control circuit,
wherein in a first period in which the starting signal terminal provides low level, the first control signal terminal provides low level and the second control signal terminal provides high level, generating, by the first processing module, low level to the first node in response to low level provided by the first control signal terminal, generating, by the second processing module, low level to the second node in response to low level provided by the first control signal terminal and low level at the first node, generating, by the third processing module, high level to the third node and high level to the fourth node in response to low level at the second node and low level at the first node, controlling, by the output module, the output terminal to output low level in response to low level at the first node, and controlling, by the shift control module, the shift control terminal to output low level in response to the first signal;
in a second period in which the starting signal terminal provides low level, the first control signal terminal provides high level, the second control signal terminal provides low level, and the first node is maintained at low level, generating, by the second processing module, high level to the second node in response to low level at the first node, maintaining high level at the third node, maintaining high level at the fourth node, maintaining low level output at the output terminal, and maintaining low level output at the shift control terminal;
in a third period in which the starting signal terminal provides high level, the first control signal terminal provides low level, and the second control signal terminal provides high level, generating, by the first processing module, high level to the first node in response to low level provided by the first control signal terminal, generating, by the second processing module, low level to the second node in response to low level provided by the first control signal terminal, generating, by the third processing module, high level to the third node in response to low level at the second node, maintaining high level at the fourth node, maintaining low level output at the output terminal, and maintaining low level output at the shift control terminal;
in a fourth period in which the starting signal terminal provides high level, the first control signal terminal provides high level, the second control signal terminal provides low level, and the first node is maintained at high level and the second node is maintained at low level, generating, by the third processing module, low level to the third node and low level to the fourth node in response to low level at the second node and low level provided by the second control signal terminal, controlling, by the output module, the output terminal to output high level in response to low level at the fourth node, and controlling, by the shift control module, the shift control terminal to output high level in response to low level at the third node or the fourth node; and
in a fifth period, the starting signal terminal provides high level, the first control signal terminal provides low level, the second control signal terminal provides high level, and the first node is maintained at high level and the second node is maintained at low level, generating, by the third processing module, high level to the third node in response to low level at the second node, maintaining low level at the fourth node, maintaining high level output at the output module, controlling, by the shift control module, the shift control terminal to output high level in response to low level at the third node, or controlling, by the shift control module, the shift control terminal to output high level or low level in response to low level at the fourth node,
wherein the shift control module comprises:
a sixteenth thin film transistor having a control electrode electrically connected to the first node, a first electrode electrically connected to the shift control terminal, and a second electrode electrically connected to the second voltage signal terminal; and
a seventeenth thin film transistor having a control electrode electrically connected to the third node, a first electrode electrically connected to the first node, and a second electrode electrically connected to the shift control terminal,
wherein controlling, by the shift control module, the shift control terminal to output high level in response to low level at the third node in the fourth period comprises: in the fourth period, switching on the seventeenth thin film transistor under low level at the third node, and transmitting high level at the first node to the shift control terminal, such that the shift control terminal outputs high level.

13. The display device according to claim 12,
wherein among the plurality of cascaded emission control circuits, the first control signal terminal of each odd-numbered stage of emission control circuit is electrically connected to a first clock signal line, and the second control signal terminal of each odd-numbered stage of emission control circuit is electrically connected to a second clock signal line; and the first control signal terminal of each even-numbered stage of emission control circuit is electrically connected to the second clock signal line, and the second control signal terminal of each even-numbered stage of emission control circuit is electrically connected to the first clock signal line.

* * * * *